(12) United States Patent
DePaula et al.

(10) Patent No.: US 10,388,599 B2
(45) Date of Patent: Aug. 20, 2019

(54) INTEGRATED CIRCUITRY AND METHODS FOR MANUFACTURING SAME

(71) Applicant: INTELLIPAPER, LLC, Spokane, WA (US)

(72) Inventors: Andrew DePaula, Spokane, WA (US); Samuel Riemersma, Spokane, WA (US); Charles Harral, Spokane, WA (US)

(*) Notice: Subject to any disclaimer, the term of this patent is extended or adjusted under 35 U.S.C. 154(b) by 0 days.

(21) Appl. No.: 15/122,393

(22) PCT Filed: Mar. 2, 2015

(86) PCT No.: PCT/US2015/018299
§ 371 (c)(1),
(2) Date: Aug. 29, 2016

(87) PCT Pub. No.: WO2015/131185
PCT Pub. Date: Sep. 3, 2015

(65) Prior Publication Data
US 2017/0069566 A1    Mar. 9, 2017

Related U.S. Application Data

(60) Provisional application No. 61/946,632, filed on Feb. 28, 2014.

(51) Int. Cl.
*H01L 21/48* (2006.01)
*H01L 21/56* (2006.01)
(Continued)

(52) U.S. Cl.
CPC ...... *H01L 23/49894* (2013.01); *H01L 21/486* (2013.01); *H01L 21/4867* (2013.01);
(Continued)

(58) Field of Classification Search
None
See application file for complete search history.

(56) References Cited

U.S. PATENT DOCUMENTS

| 4,746,392 A * | 5/1988 | Hoppe | G06K 19/07745 |
| | | | 156/244.12 |
| 6,234,379 B1 * | 5/2001 | Donges | B23K 3/0623 |
| | | | 228/180.22 |

(Continued)

FOREIGN PATENT DOCUMENTS

| JP | 2013-159864 | 8/2013 |
| WO | PCT/US2015/018299 | 6/2015 |
| WO | PCT/US2015/018299 | 9/2016 |

*Primary Examiner* — Nishath Yasmeen
(74) *Attorney, Agent, or Firm* — Wells St. John P.S.

(57) ABSTRACT

Processes for manufacturing cellulose based integrated circuitry constructions are provided, the processes can include providing a first substrate having a plurality of vias; providing a first conductive material to the one surface of the substrate; providing adhesive to the other surface; providing a monolithic electronic component to the other surface; providing a second conductive material to the other surface and the monolithic electronic component; providing a backing material to the other surface of the substrate; and providing a second substrate to the backing material to form the construction. A cellulose based integrated circuitry constructions are provided that can include, comprising a first cellulose substrate having one surface opposing another surface and defining a plurality of vias between the surfaces; a first conductive material along the one surface and extending through the vias; a monolithic electronic component on the other surface; and a second conductive material along the other surface and conductively connecting the first conductive material with the monolithic electronic component; and/or a pair of cellulose substrates having a monolithic electronic component therebetween; and backing (Continued)

material between the substrates, the backing material defining a recess and receiving the monolithic electronic component.

5 Claims, 7 Drawing Sheets

(51) Int. Cl.
 *H01L 23/14* (2006.01)
 *H01L 23/31* (2006.01)
 *H01L 23/498* (2006.01)
(52) U.S. Cl.
 CPC ............. *H01L 21/56* (2013.01); *H01L 23/14* (2013.01); *H01L 23/3121* (2013.01); *H01L 23/49827* (2013.01); *H01L 23/49833* (2013.01); *H01L 23/49838* (2013.01); *H01L 23/49855* (2013.01); *H01L 2924/0002* (2013.01)

(56) References Cited

U.S. PATENT DOCUMENTS

| | | | |
|---|---|---|---|
| 6,841,415 B2* | 1/2005 | Suzuki | H01L 21/563 257/E21.503 |
| 7,374,107 B2* | 5/2008 | Bertrand | G06K 19/07749 235/492 |
| 2003/0139004 A1* | 7/2003 | Yoshida | H01L 21/563 438/200 |
| 2010/0102133 A1* | 4/2010 | DePaula | G06K 19/041 235/492 |
| 2012/0081868 A1 | 4/2012 | DePaula et al. | |
| 2012/0120585 A1 | 5/2012 | Yu et al. | |
| 2013/0126091 A1* | 5/2013 | Schrittwieser | C09J 163/00 156/332 |
| 2013/0170158 A1 | 7/2013 | Van Abeelen et al. | |

* cited by examiner

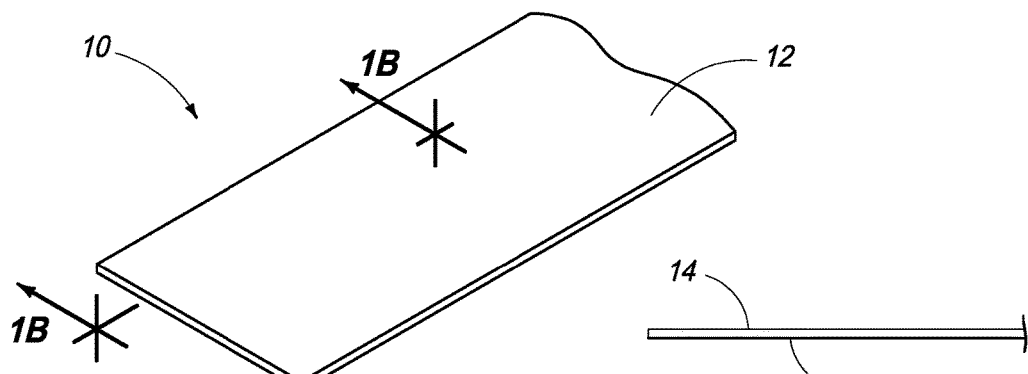
FIG. 1A
FIG. 1B
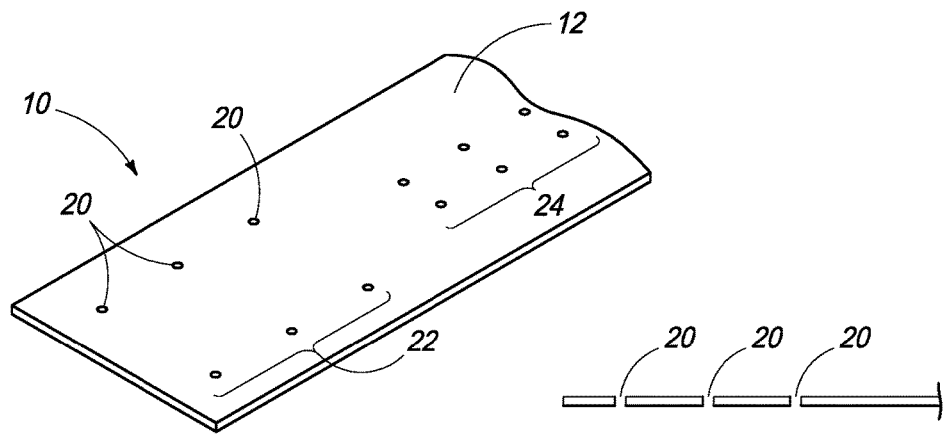
FIG. 2A
FIG. 2B
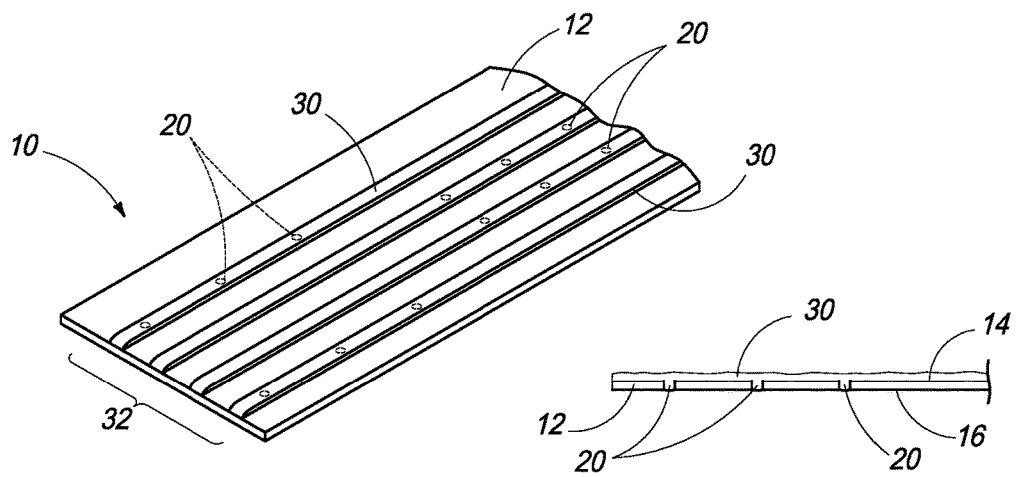
FIG. 3A
FIG. 3B

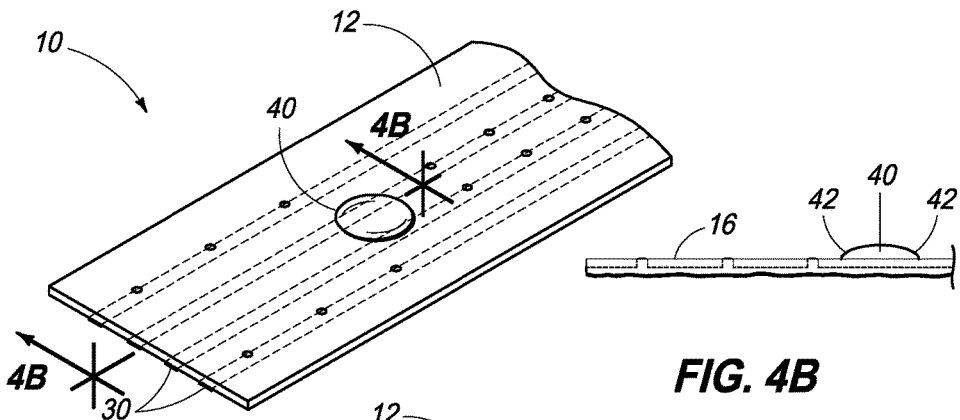
FIG. 4A
FIG. 4B
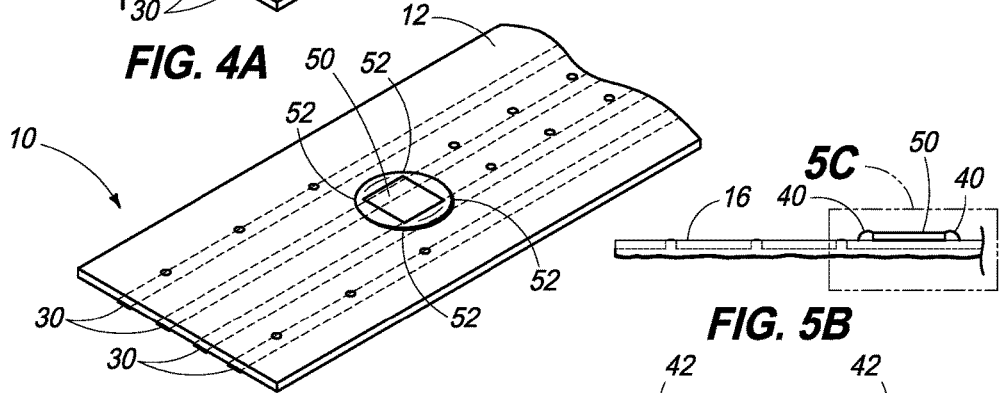
FIG. 5A
FIG. 5B
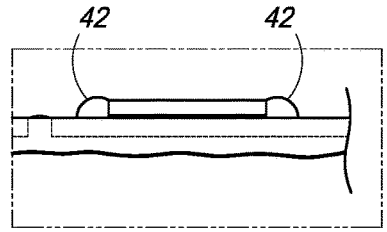
FIG. 5C
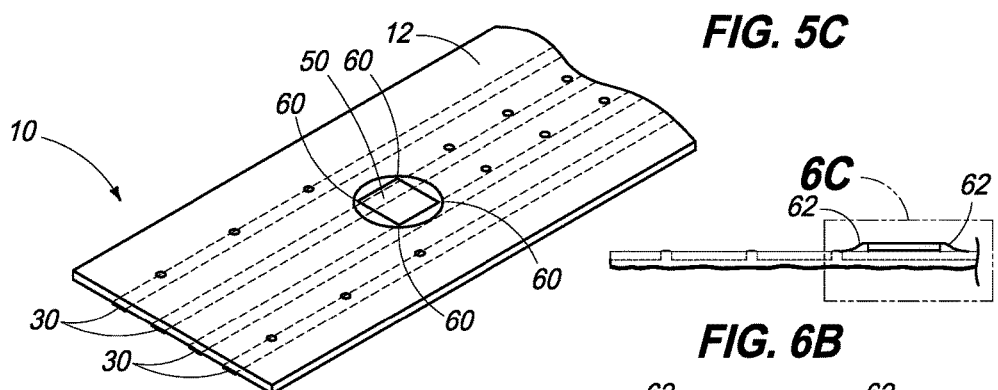
FIG. 6A
FIG. 6B
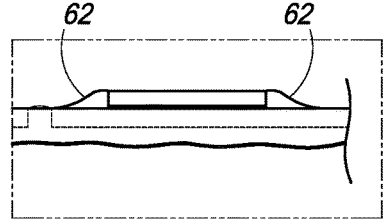
FIG. 6C

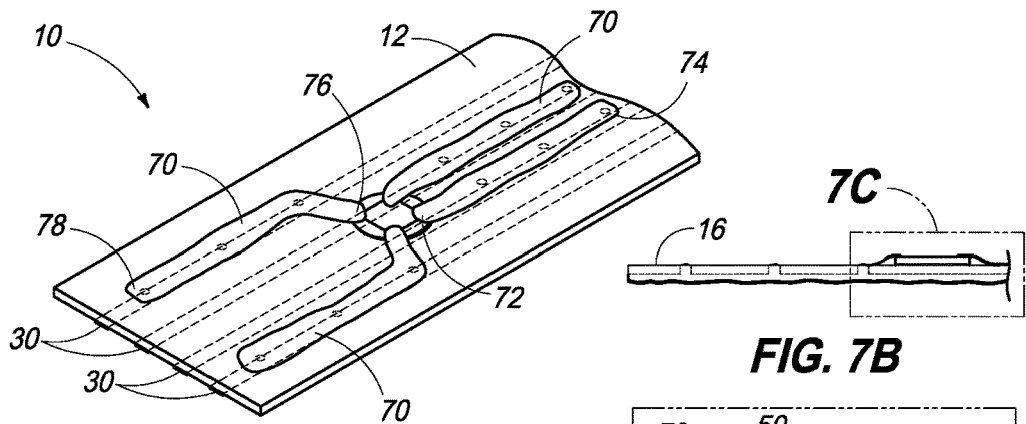
FIG. 7A
FIG. 7B
FIG. 7C
FIG. 7D
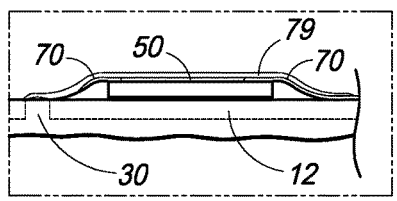
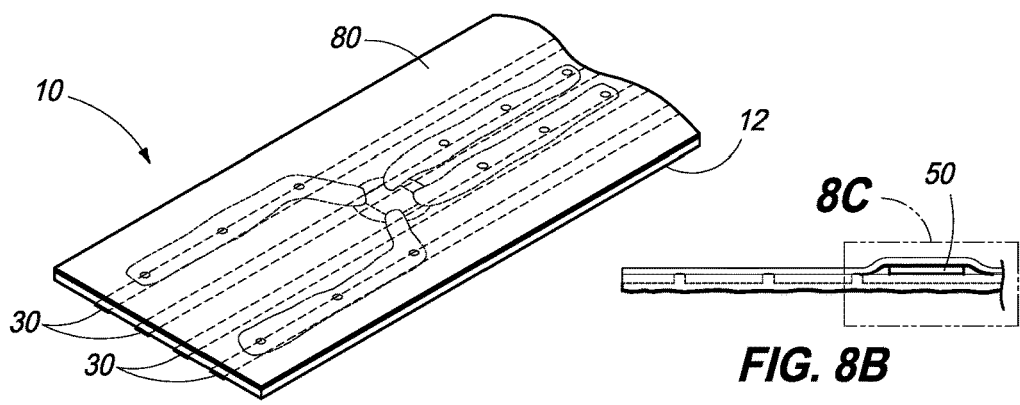
FIG. 8A
FIG. 8B
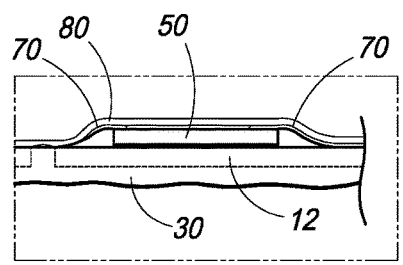
FIG. 8C

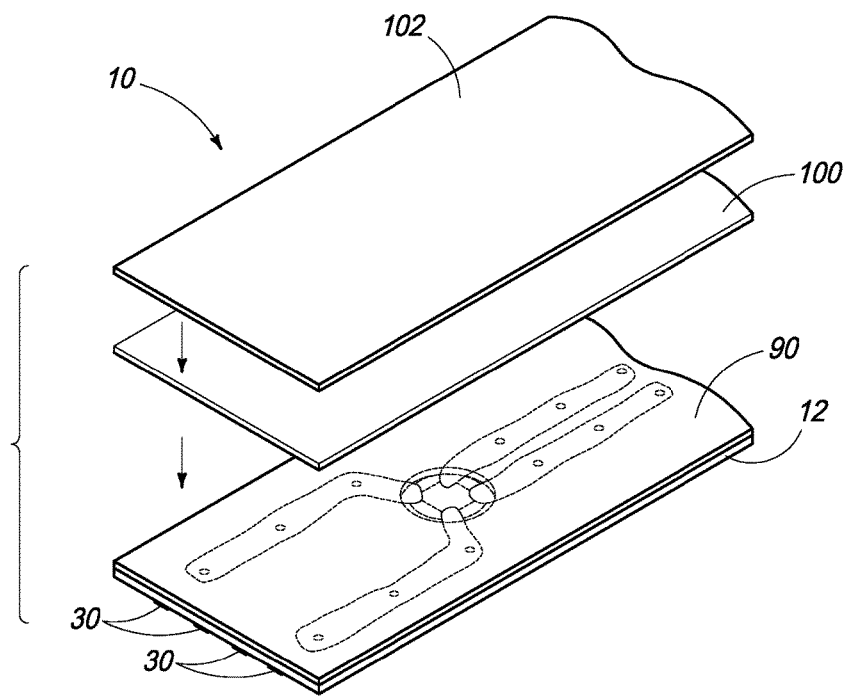
FIG. 10
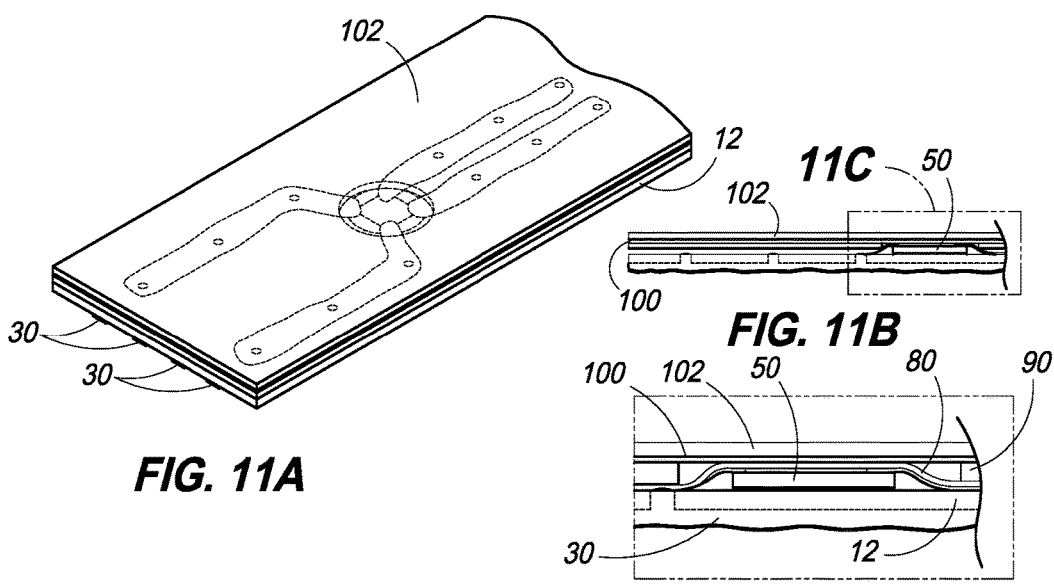
FIG. 11A
FIG. 11B
FIG. 11C

US 10,388,599 B2

INTEGRATED CIRCUITRY AND METHODS FOR MANUFACTURING SAME

RELATED PATENT DATA

This application is a 35 U.S.C. § 371 of and claims priority to PCT International Application Number PCT/US2015/018299, which was filed 2 Mar., 2015, and was published in English, which claims priority under 35 U.S.C. § 119 to U.S. Provisional Patent Application No. 61/946,632 which was filed 28 Feb., 2014, the entirety of each of which is incorporated herein by reference.

TECHNICAL FIELD

The present disclosure in various embodiments relates to integrated circuitry and methods for manufacturing same. Specific embodiments of the disclosure relate to cellulose-based integrated circuitry and methods for manufacturing same. The technology relates to that disclosed in issued U.S. Pat. No. 8,047,443 entitled "Data Storage Devices" to DePaula.

BACKGROUND

Traditional means of transmitting or communicating has included the use of cellulose based documents such as, for example, papers. These papers take the form of newspapers, correspondence, mailers, leaflets, etc., and they have been used throughout history to correspond and transmit information. Recently, information in addition to what is printed on the paper document can be transmitted as well. Part of this transmission is the use of circuitry integrated into the paper itself. The present disclosure provides embodiments of integrated circuitry as well as methods for making same that may be part of cellulose-based documents.

SUMMARY

A process for manufacturing cellulose based integrated circuitry construction is provided, the process comprising providing a first substrate having one surface opposing another surface; providing a plurality of vias within the substrate and between the surfaces; providing a first conductive material to the one surface of the substrate; providing adhesive to the other surface; providing a monolithic electronic component to the other surface; providing a second conductive material to the other surface and the monolithic electronic component; providing a backing material to the other surface of the substrate; and providing a second substrate to the backing material to form the construction. A cellulose based integrated circuitry construction is provided, comprising a first cellulose substrate having one surface opposing another surface and defining a plurality of vias between the surfaces; a first conductive material along the one surface and extending through the vias; a monolithic electronic component on the other surface; and a second conductive material along the other surface and conductively connecting the first conductive material with the monolithic electronic component. A cellulose based integrated circuitry construction is provided, comprising a pair of cellulose substrates having a monolithic electronic component therebetween; and backing material between the substrates, the backing material defining a recess and receiving the monolithic electronic component.

BRIEF DESCRIPTION OF THE DRAWINGS

Embodiments of the disclosure are described below with reference to the following accompanying drawings.

FIGS. 1A and B are depictions of a substrate and cross section of same at a stage of processing according to an embodiment of the disclosure.

FIGS. 2A and 2B depict the substrate of FIGS. 1A and 1B at a subsequent stage of processing according to an embodiment of the disclosure.

FIGS. 3A and 3B depict the substrate of FIGS. 2A and 2B at a subsequent stage of processing according to an embodiment of the disclosure.

FIGS. 4A and 4B depict the substrate of FIGS. 3A and 3B at a subsequent stage of processing according to an embodiment of the disclosure.

FIGS. 5A, 5B, and 5C depict the substrate of FIGS. 4A and 4B at a subsequent stage of processing according to an embodiment of the disclosure.

FIGS. 6A, 6B, and 6C depict the substrate of FIGS. 5A, 5B, and 5C at a subsequent stage of processing according to an embodiment of the disclosure.

FIGS. 7A, 7B, 7C, and 7D depict the substrate of FIGS. 6A, 6B, and 6C at a subsequent stage of processing according to an embodiment of the disclosure.

FIGS. 8A, 8B, and 8C depict the substrate of FIGS. 7A, 7B, 7C, and 7D at a subsequent stage of processing according to an embodiment of the disclosure.

FIG. 10 is a depiction of the substrate of FIGS. 9A, 9B, and 9C at a subsequent stage of processing according to an embodiment of the disclosure.

FIGS. 11A, 11B, and 11C depict the construction of FIG. 10 at a subsequent stage of processing according to an embodiment of the disclosure.

DESCRIPTION

Figure 9A:
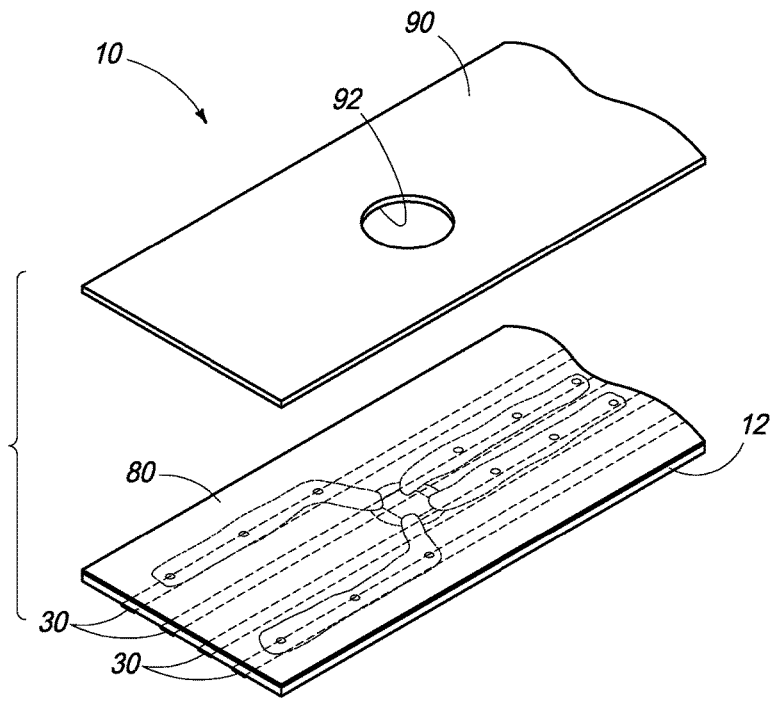
FIGS. 9A, 9B, and 9C depict the substrate of FIGS. 8A, 8B, and 8C at a subsequent stage of processing according to an embodiment of the disclosure.
Figure 9B:
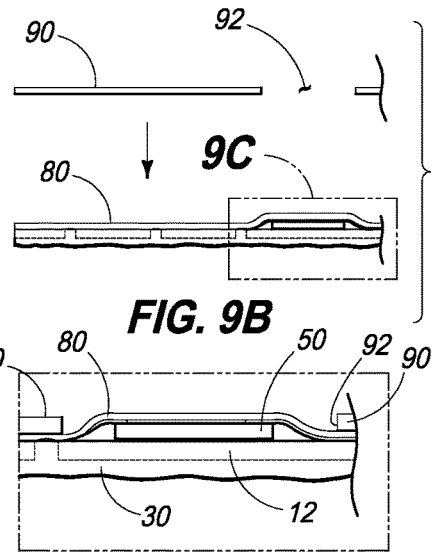
Figure 9C:
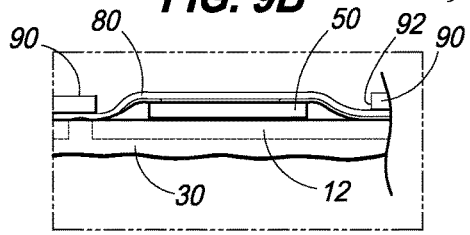

Integrated circuitry and methods for making same are described with reference to FIGS. 1-13. Referring first to FIG. 1, in the first step of the process to prepare the integrated circuitry, a substrate 12 is provided. Substrate 12 may or may not be a cellulose-based substrate. Substrate 12 may also be constructed of fiber-based materials such as but not limited to fiberglass materials. In accordance with example implementations, substrate 12 may also include materials that include insulative metal and/or inorganic materials. Substrate 12 may include one surface 14 opposing another surface 16, for example.

Referring next to FIG. 2, substrate 12 may have vias 20 formed therein. These vias may be provided as a plurality in the form of one set of rows 22 and another set of rows 24. According to example configurations, these rows may be offset, for example, as shown in FIG. 2A. Referring to FIG. 2B, vias 20 may extend the entirety between surface 14 and surface 16 within substrate 12, for example. According to example implementations these vias may be formed utilizing laser equipment, for example, and may have a size sufficient to allow for the transmission of fluid conductive material upon application as will be described in later steps.

Referring next to FIGS. 3A and 3B, conductive material 30 may be placed on one surface 14 of substrate 12, for example, and this conductive material 30 can be applied in rows that may be consistent with sets or rows of via 20, for example, and as shown in FIG. 3A. As described, conductive material 30 may be provided in a plurality of lines 32, for example. As shown in FIG. 3B, for example, conductive material 30 may extend through vias 20 and approach opposing surface 16 of substrate 12, for example. Conductive material 30 can be, for example, a metallic material such as a silver based material, and may be applied to substrate 12 utilizing lithographic techniques, for example. One such lithographic technique can include silk screening the conductive material upon substrate 12, for example.

Referring next to FIGS. 4A and 4B, adhesive 40 can be applied to surface 16 of substrate 12, for example. This adhesive 40 when applied can provide a convex surface 42 defining the perimeter of adhesive 40, for example. Adhesive 40 can include acetate and/or alcohol based adhesives such as but not limited to polyvinyl acetate and/or polyvinyl alcohol based adhesives. Adhesive 40 can be a water-based adhesive. Adhesive 40 can be applied as a dollop of adhesive, for example, and applied in a manner configured to receive a monolithic electronic component 50.

Referring next to FIG. 5A, monolithic electronic component 50 can be placed within adhesive 40 upon substrate 12 prior to adhesive 40 curing. In accordance with example implementations, and with specific reference to FIGS. 5B and 5C, as shown, adhesive 42 can maintain a convex outer surface when monolithic electronic component 50 is placed upon same. There also remains coverage 52 between monolithic electronic component 50 and adhesive 40, for example, thereby completely, for example, sealing monolithic electronic component 50 within adhesive 40.

Monolithic electronic component 50 can include storage circuitry such as a semiconductor chip that includes circuitry for accessing data. Component 50 can take the form of die and/or chip. Component 50 can be a resistor, capacitor, and/or inductor. Monolithic electronic component 50 can include read-write memory such as flash memory, and/or read only memory. Monolithic electronic component 50 can include connection points that may be electrically connected to other conductive material, for example. In accordance with example implementations, monolithic electronic component 50 may include at least two connection points that may be connected to conductive material according to later processing steps referred to herein, for example. Monolithic electronic component 50 may have a capacity to store up to hundreds of megabytes or up to tens of gigabytes.

Referring to FIGS. 6A through 6C, monolithic electronic component 50 is shown within adhesive 40 upon curing of adhesive 40. As shown, there still remains coverage 60 between adhesive 40 and monolithic electronic component 50; however, this coverage 60 is substantially less than coverage 52 shown in FIG. 5A upon curing. Further, the convex surface 42 shown in FIG. 5A can then be at least partially concave surface 62, wherein the adhesive is no longer above the upper surface of monolithic electronic component 50, but resides below the surface.

Referring next to FIGS. 7A through 7D, conductive material 70 can be applied to surface 16. Conductive material 70 can also be applied in strips or lines. For example, conductive material 70 can extend from one end 72 to another end 74 in one embodiment; or one end 76 to another end 78 in another portion of construction. In accordance with example implementations, one end 72 and/or 76 can contact the contact point of monolithic electronic component 50, for example, and extend over substrate 12 to electrically connect with conductive material 30 that extends through vias 20 previously formed. In accordance with example configurations, the contact points of monolithic electronic component 50 can be placed at corner sections of monolithic electronic component 50 with contact points opposing each other across monolithic electronic component 50 and across corners. As shown in FIG. 7C, conductive material 70 can extend up to these corners of monolithic electronic component 50 and then down upon the surface 16 of substrate 12. In accordance with example implementations, this conductive material 70 can be a silver based conductive material and may be provided to the substrate via application from a brush, syringe, filament, sprayed, and/or stamped, for example. Referring to FIG. 7D, additional sealing material 79 may be placed upon monolithic electronic component 50 as well as material 70. Material 79 may include adhesive like material, such as water-based materials including acetate and/or alcohol based adhesives such as but not limited to polyvinyl acetate and/or polyvinyl alcohol based adhesives.

Referring next to FIG. 8A, an adhesive material 80 can be applied above surface 16, for example, encompassing or covering at least the preparation of the conductive material 70. Adhesive material 80 can be applied as a sheet and then cured under heat and/or pressure conditions. Adhesive material 80 can include but is not limited to thermoplastic adhesives such as hot melt adhesives. Material 80 can include ethylene-vinyl acetate, polyolefins, polyamides, polyesters, polyurethanes, and/or styrene block copolymers, for example.

Referring next to FIG. 9A, a backing material or overcoat material can be provided that includes a recess 92. Recess 92 can be configured to receive at least a portion of monolithic electronic component 50, for example, and this backing 90 can be applied over adhesive material 80. Upon application of the backing material, the entire construction can be baked/heated, pressurized, and/or RF energy applied to adhere backing 90 to substrate 12, and substantially encase the conductive material between the backing and substrate 12.

Referring next to FIG. 10, an additional substrate 102 can be adhered to or laminated to the construction that includes substrate 12 and backing 90 using another adhesive material 100. This can be performed through typical paper lamination techniques, thereby substantially encasing the processing circuitry between substrate 12 and substrate 100 as shown in FIGS. 11A-11C.

Figure 12:
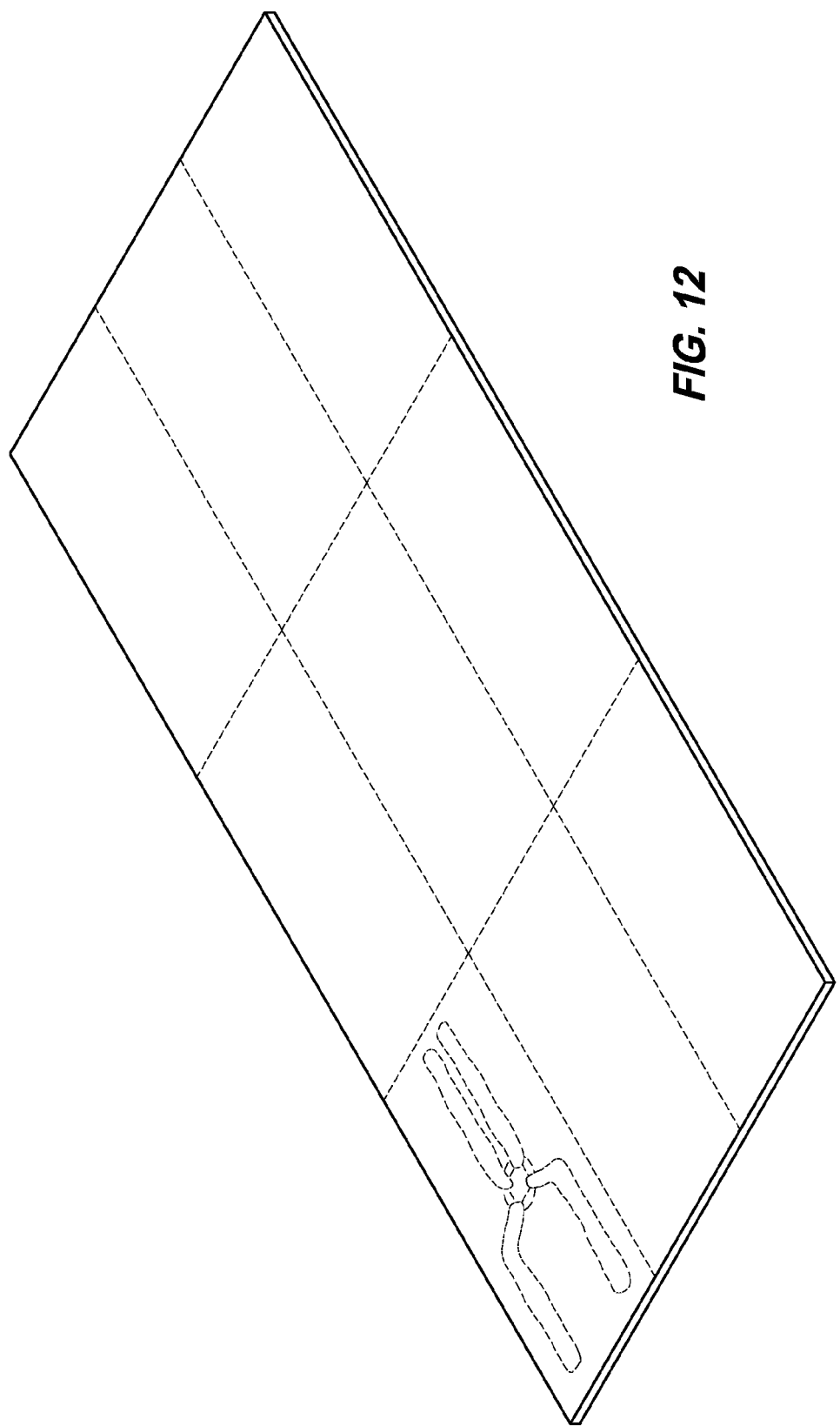
FIG. 12 is an example cellulose based integrated circuitry according to an embodiment of the disclosure.

Referring next to FIG. 12, an example integrated circuitry is shown that includes at least a portion of the integrated circuitry demonstrated herein. This is but an example of how this single integrated circuitry can be applied to multiple portions of a substrate. Further, this integrated circuitry can take many forms and many manifestations as may be desired. One such a design is shown in FIG. 13, and that design includes the following characteristics, for example.

Figure 13:
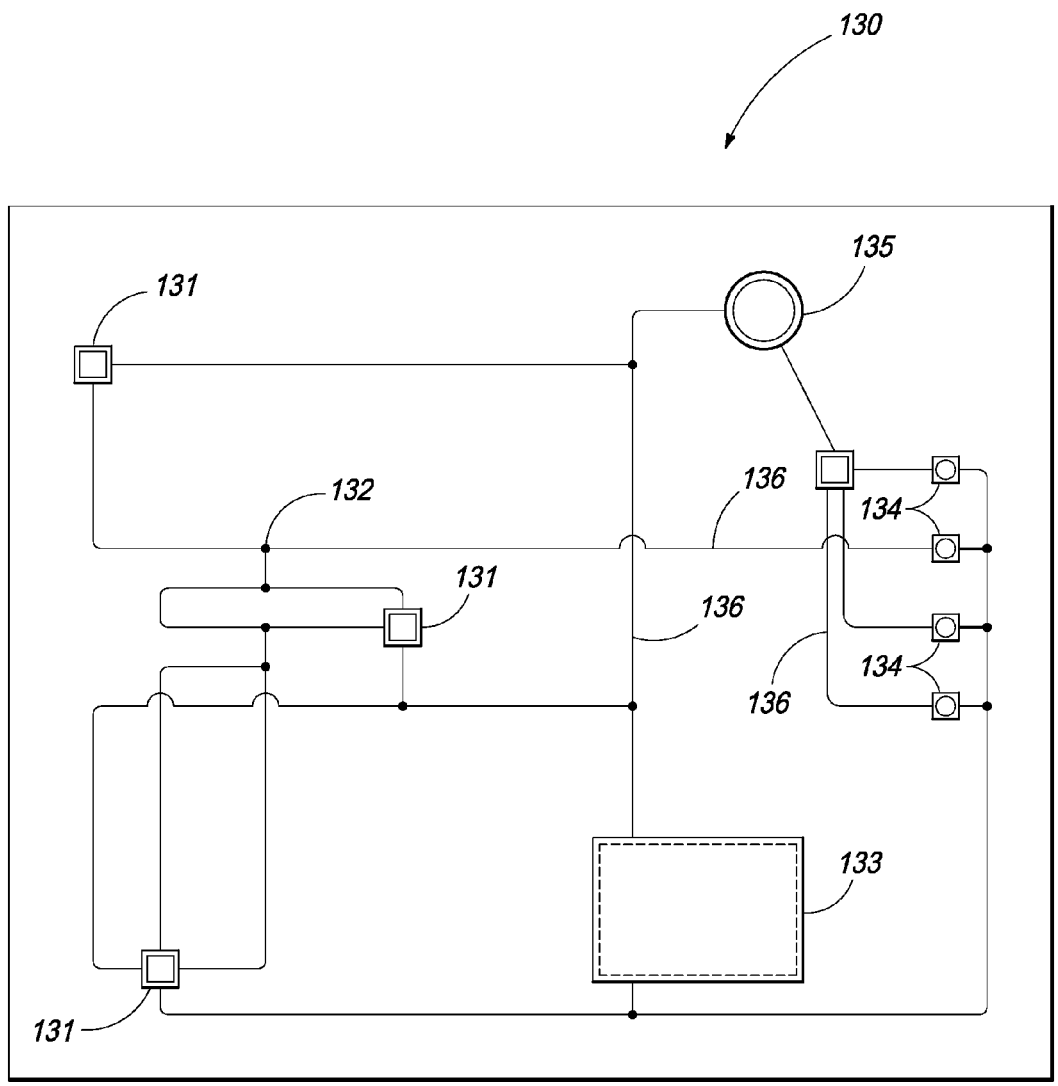
FIG. 13 is an example integrated circuitry according to an embodiment of the disclosure.

Referring to FIG. 13, integrated circuitry 130 is shown that may include a plurality of monolithic electronic components 131 connected via metallic lines 136. Within this circuitry can be resistors and/or capacitors 132 as well as battery and/or power source 133. Circuitry 130 can also include led indicator lights 134 as well as switch 135. All or part of circuitry 130 can be prepared according to the processes described herein.

What is claimed is:
1. A process for manufacturing cellulose based integrated circuitry construction, the process comprising:
   providing a first cellulose substrate having one surface opposing another cellulose surface;
   providing a plurality of vias within the first cellulose substrate and between the surfaces;
   providing a first conductive material to the one surface of the first cellulose substrate;

providing adhesive to the other cellulose surface, wherein when provided the adhesive defines a convex surface;

providing a monolithic electronic component upon the convex surface of the adhesive to couple the monolithic electronic component with the other cellulose surface of the first cellulose substrate, wherein the adhesive maintains a convex form about a perimeter of the monolithic electronic component;

curing the adhesive to form a concave surface of the adhesive about the perimeter of the monolithic electro me component;

providing a second conductive material to the other cellulose surface and the monolithic electronic component;

providing a backing material to the other cellulose surface of the first cellulose substrate; and providing a second substrate to the backing material to form the construction.

2. The process of claim 1 wherein the vias are provided in rows.

3. The process of claim 2 wherein the rows are offset.

4. The process of claim 1 wherein the vias confine the first conductive material.

5. The process of claim 1 wherein the adhesive is provided as a dollop.

* * * * *